United States Patent
Wu

(10) Patent No.: US 7,012,763 B2
(45) Date of Patent: Mar. 14, 2006

(54) APERTURE PLATE FOR LITHOGRAPHY SYSTEMS

(75) Inventor: Yuan-Hsun Wu, Tao-Yuan Hsien (TW)

(73) Assignee: Nanya Technolog Corp., Tao-Yuan Hsien (TW)

( * ) Notice: Subject to any disclaimer, the term of this patent is extended or adjusted under 35 U.S.C. 154(b) by 1 day.

(21) Appl. No.: 10/709,311

(22) Filed: Apr. 28, 2004

(65) Prior Publication Data

US 2005/0243440 A1    Nov. 3, 2005

(51) Int. Cl.
*G02B 27/00* (2006.01)
*G03B 27/72* (2006.01)

(52) U.S. Cl. ........................ 359/738; 355/67
(58) Field of Classification Search ........ 359/738–740; 355/53, 67
See application file for complete search history.

(56) References Cited

U.S. PATENT DOCUMENTS 6,842,224 B1 *  1/2005  Mori ........................... 355/53

\* cited by examiner

*Primary Examiner*—Scott J. Sugarman
(74) *Attorney, Agent, or Firm*—Winston Hsu

(57) ABSTRACT

An aperture plate for lithography systems capable of improving NILS. The aperture plate includes a light-intercepting region and a light-transmitting region. The light-intercepting region has a reference center point. A horizontal reference line and a vertical reference line are defined on the light-intercepting region and intersect the reference center point. The light-transmitting region includes four pole apertures defining a central area. Two of the pole apertures are positioned on the horizontal reference line, and the other pole apertures are positioned on the vertical reference line. The light-transmitting region further includes at least a symmetric pattern aperture positioned in the central area, wherein the symmetric pattern aperture has a symmetric center overlapping the reference center point.

11 Claims, 9 Drawing Sheets

APERTURE PLATE FOR LITHOGRAPHY SYSTEMS

BACKGROUND OF INVENTION

1. Field of the Invention

The invention relates to an aperture plate for lithography systems, and more particularly, to an aperture plate which can improve the normalized image log slope (NILS) of lithography systems to avoid the problem of forbidden pitch.

2. Description of the Prior Art

The lithographic process is a very important step in semiconductor fabrication that transfers the layout of a designed integrated circuit onto a semiconductor wafer. Lithographic and development technologies are used to proportionally transfer the circuit design pattern onto a photoresist layer on the surface of the semiconductor wafer. As the complexity and the integration of semiconductor circuits increases, the size of the circuit design pattern on the photoresist layer decreases. However, the critical dimensions (CDs) of the pattern on the photoresist layer are limited by the resolution limit of the optical exposure tool. As a result, optical proximity effects easily occur in the lithographic process during the formation of highly integrated circuit design patterns on a semiconductor wafer resulting from overexposure or underexposure, which causes a loss of resolution. In other words, optical proximity effects cause a difference between the pattern transferred onto the photoresist layer and the original design pattern.

Please refer to FIG. 1. FIG. 1 is a schematic diagram of a lithography system 10 according to the prior art. The lithography system 10 comprises a scanner system 12 and a semiconductor wafer 24. The scanner system 12 includes a light source 14 positioned near a top region of the scanner system 12, a first lens 16, an aperture plate 18, a second lens 20, and a photomask 22. Light beams from the light source 14 pass through the first lens 16, the aperture plate 18, the second lens 20, and the photomask 22 to the die region 26 to define a pattern of the photomask 22 on the photoresist layer on the wafer 24.

The aperture plate 18 is an application of the off-axis illumination (OAI) method, which has a light-intersecting region on the middle area of the aperture plate 18 for blocking vertical incident light to increase the resolution and depth of focus (DOF) of the lithography process. In order to increase the integration of semiconductor products unceasingly and keep the accuracy at the same time, manufactures have undertaken research and development to refine the aperture pattern of the aperture plate 18 so as to improve the transferring performance through a common light source, such as the light with a wavelength of 248 nm, and the equipment on hand. Among the several kinds of aperture patterns, Quadrupole 90 is a four-pole aperture pattern, which has an included angle of 90 degrees with the horizontal axis. In contrast to other aperture patterns, such as an annular aperture, Quadrupole 90 can improve the array CD of the lithography process. However, when the design pattern of the photomask is more and more delicate, the lithography system using the Quadrupole 90 aperture plate encounters the problem of forbidden pitch on the condition of specific pitches, which means the NILS cannot match the lowest requirement of the lithography system, resulting in defects of transferring performance.

SUMMARY OF INVENTION

It is therefore a primary objective of the claimed invention to provide an aperture plate pattern to solve the above-mentioned problem of forbidden pitch occurring in the prior art Quadrupole 90 aperture plate.

According to the claimed invention, an aperture plate that can improve the NILS value of the lithography system is provided. The aperture plate comprises a light-intercepting region and a light-transmitting region. The light-intercepting region has a reference center point, a horizontal reference line intersecting the reference center point, and a vertical reference line intersecting the reference center point defined on the light-intercepting region. The light-transmitting region comprises four pole apertures defining a central area, wherein two of the pole apertures are positioned on the horizontal reference line and the other two pole apertures are positioned on the vertical reference line. The light-transmitting region further comprises at least a symmetric pattern aperture positioned in the central area, having a symmetric center which overlaps the reference center point.

It is an advantage of the claimed invention that the aperture plate comprises at least a symmetric pattern aperture near the middle of the aperture plate so that the analogously vertical incident light beams can pass through the aperture plate for improving the image contrast and resolution; meanwhile, the advantage of the Quadrupole 90 aperture pattern that improves the resolution of array CD can be maintained. As a result, the performance of the lithography process for semiconductor products with high integration can be improved.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
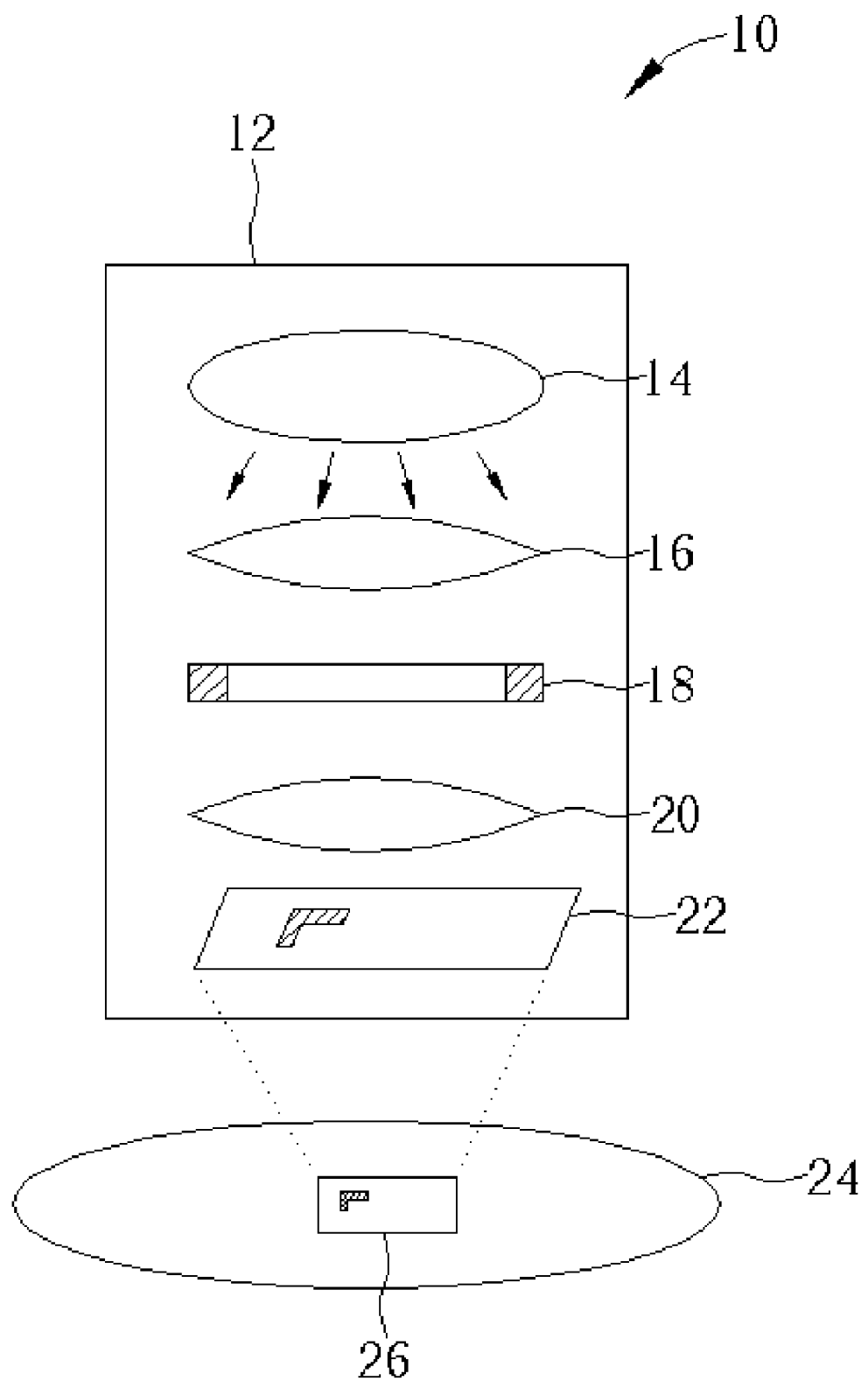
FIG. 1 is a schematic diagram of a lithography system according to prior art.
Figure 2:
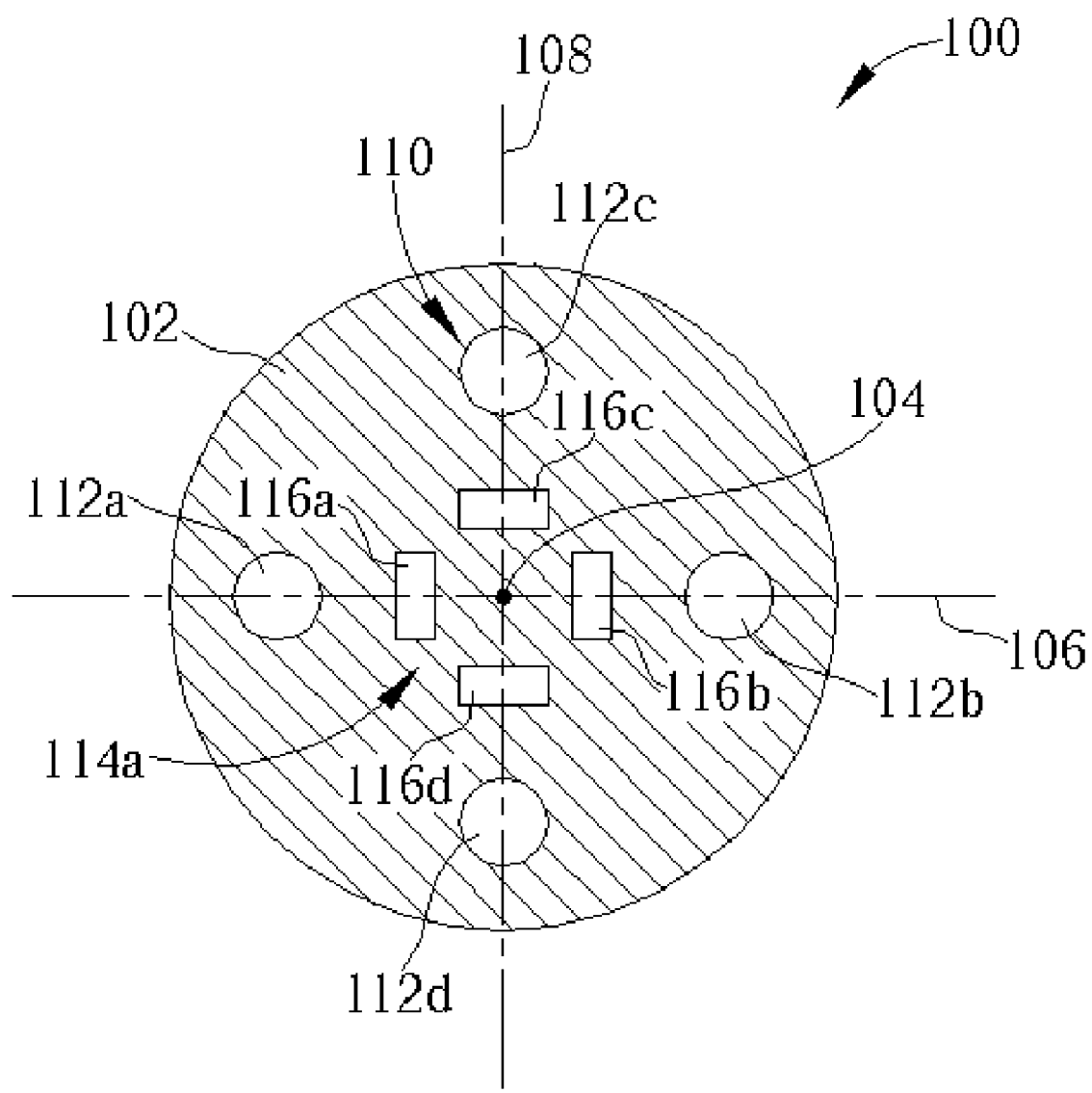
FIG. 2 is a schematic diagram of an aperture plate pattern of a first embodiment of the present invention.

Please refer to FIG. 2, which is a schematic diagram of an aperture plate pattern of the first embodiment of the present invention. The aperture plate pattern 100 comprises a light-intercepting region 102 (the hatched region) occupying a majority of the area of the aperture plate pattern 100 exposed under light beams from a light source. A reference center point 104 is defined on the surface of the light-intercepting region 102. In addition, a horizontal reference line 106 and a vertical reference line 108 intersecting the reference center point 104 are defined on the light-intercepting region 102.

The aperture plate pattern 100 further comprises a light-transmitting region 110 including a plurality of apertures, the four pole apertures 112a, 112b, 112c, 112d and at least a symmetric pattern aperture 114a. The pole apertures 112a and 112b are positioned on the horizontal reference line 106 and on two sides of the reference center point 104. The pole apertures 112c and 112d are positioned on the vertical reference line 108 and on two sides of the reference center point 104. In this embodiment, each of the pole apertures 112a, 112b, 112c, and 112d is the same distance away from the reference center point 104.

The symmetric pattern aperture 114a is positioned in a central area defined by the pole apertures 112a, 112b, 112c, and 112d and comprises four rectangular apertures 116a, 116b, 116c, and 116d. The symmetric pattern aperture 114a is horizontally and vertically symmetric with reference to a symmetric center that overlaps the reference center point 104. In addition, the rectangular apertures 116a, 116b, 116c, and 116d are positioned between the pole apertures 112a, 112b, 112c, 112d and the reference center point 104 respectively. As shown in FIG. 2, the horizontal reference line 106 intersects two of the rectangular apertures 116a and 116b by separating them into equivalent portions. And the vertical reference line 108 intersects the other rectangular apertures 116c and 116d as a bisector, too.

The installation of the symmetric pattern aperture 104a provides a function that the amount of the light passing through the middle portion of the aperture plate is much more than that of the conventional Quadrupole 90 aperture pattern, and therefore the NILS value of the lithography system can be raised and the problem of forbidden pitch can be solved. Accordingly, the lithography process can have a better transferring performance through adjusting the shape and size of the symmetric pattern aperture 114a.

Figure 3:
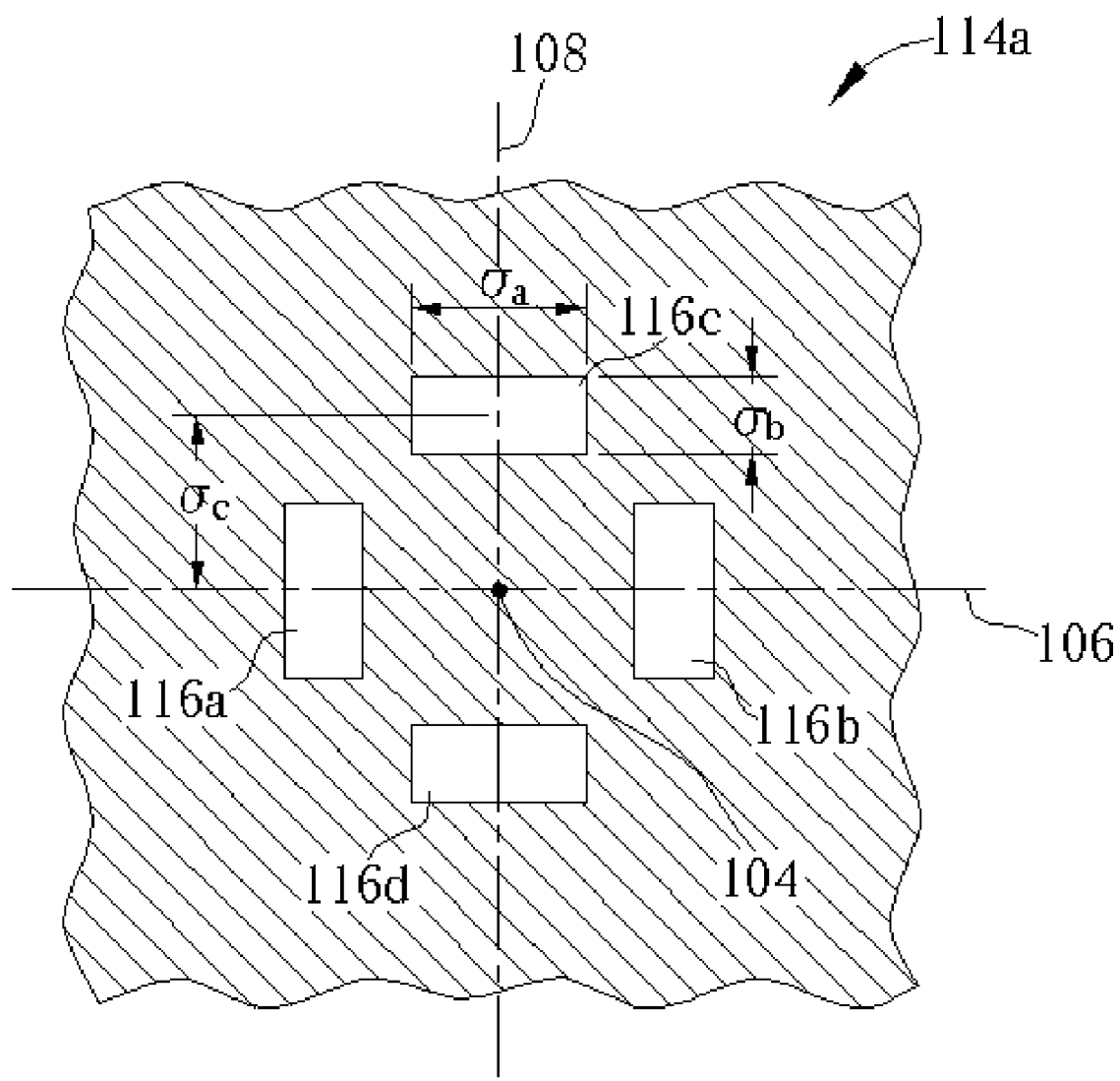
FIG. 3 is a partially enlarged view of the symmetric pattern aperture shown in FIG. 2.

Please refer to FIG. 3, which is a partially enlarged view of the symmetric pattern aperture 14a shown in FIG. 2. The design of the symmetric pattern aperture 114a can be determined according to several factors. Taking the rectangular aperture 116c as an example, factor $\sigma_c$ presents the distance between its center and the reference center point 104; the factors $\sigma_a$ and $\sigma_b$ present the length and width of the rectangular aperture 116c respectively. When applying the present invention, values of the factors $\sigma_a$, $\sigma_b$, and $\sigma_c$ are used to design the symmetric pattern aperture 114a, in coordination with the four pole apertures 112a, 112b, 112c, 112d with different sizes and positions, to optimize the performance of the lithography system for having a preferable NILS value.

In addition, the arrangement of the rectangular apertures 116a, 116b, 116c, 116d is not limited by the illustration in FIG. 2. For example, when designing the symmetric pattern aperture 114a, the arrangement of the rectangular apertures 116a, 116b, 116c, 116d can be rotated by 45 degrees, which means each of the rectangular apertures 116a, 116b, 116c, 116d is positioned between the horizontal reference line 106 and the vertical reference line 108, provided that the reference center point 104 still serves as the symmetric center of the rotated rectangular apertures 116a, 116b, 116c, 116d for achieving the goal of increasing the NILS and avoiding the problem of forbidden pitch.

On the other hand, the symmetric pattern aperture of the present invention aperture plate is not limited by the pattern of four rectangular apertures in the first embodiment of the present invention. Other aperture patterns that take the reference center point as symmetric centers can also be used to complete the present invention aperture plate pattern.

Figure 4:
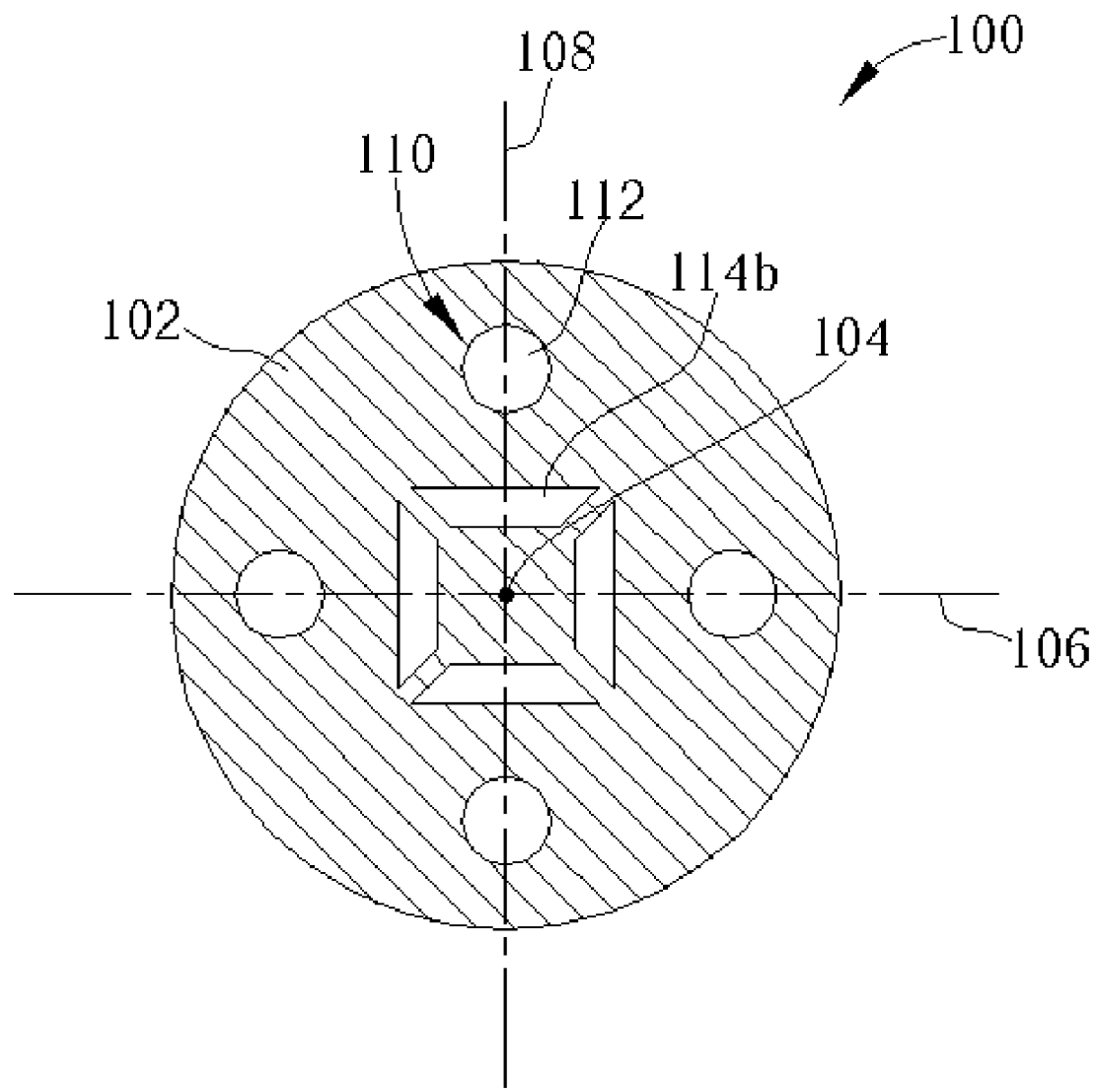
FIG. 4 is a schematic diagram of an aperture plate pattern of a second embodiment of the present invention.

Please refer to FIG. 4. FIG. 4 is a schematic diagram of an aperture plate pattern of the second embodiment of the present invention. As shown in FIG. 4, the aperture plate pattern 100 has a light-intercepting region 102 (the hatched region) the same as the first embodiment of the present invention. The aperture plate pattern 100 also has a light-transmitting region 110 that comprises four pole apertures 112 and a symmetric pattern aperture 114b. In this embodiment, the symmetric pattern aperture 114b comprises four trapezoid apertures so that the symmetric pattern aperture 114b seems like an analogous square frame, wherein the horizontal reference line 106 and the vertical reference line 108 separate each of the trapezoid apertures they intersect into two equivalent portions.

Figure 5:
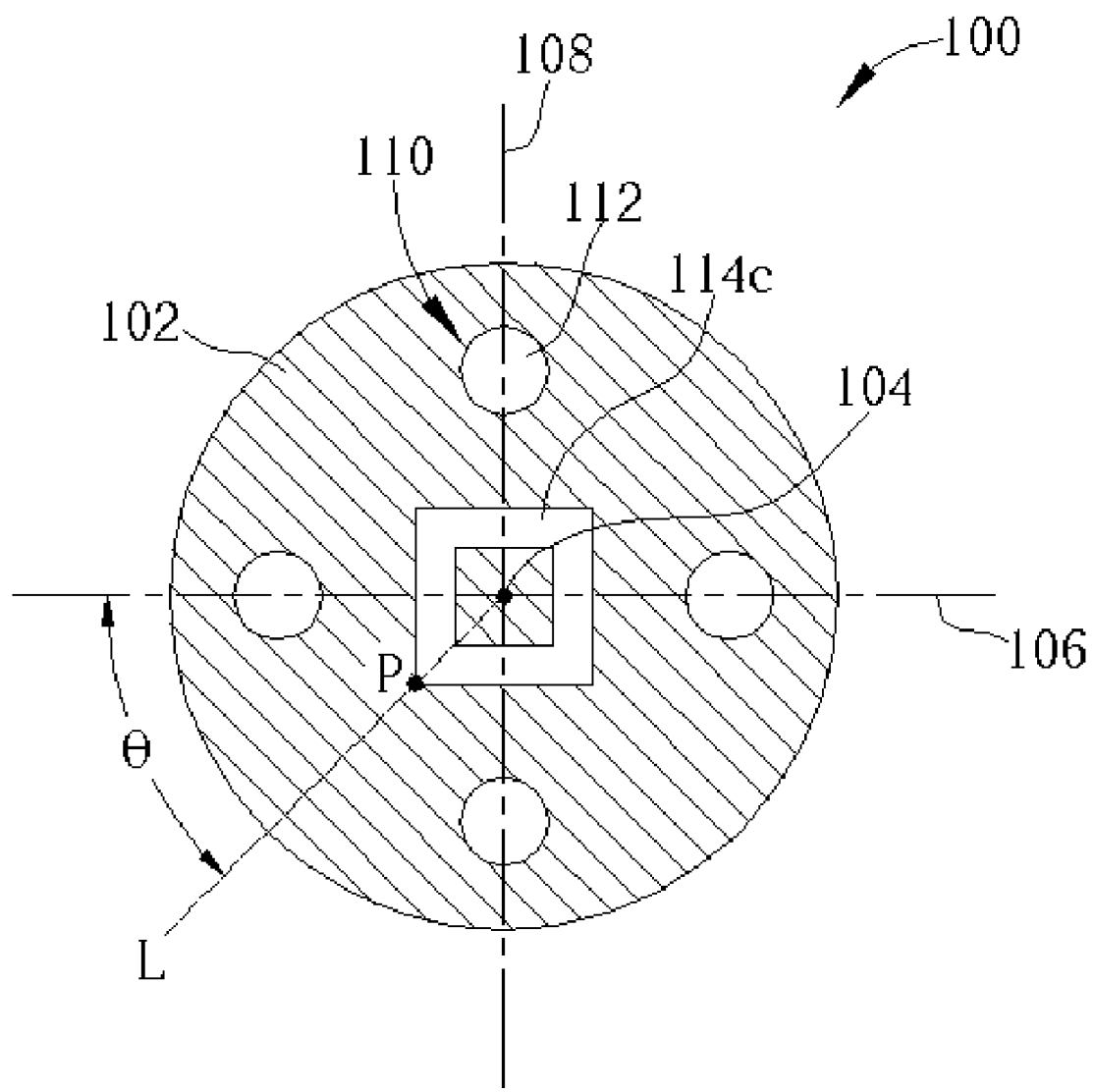
FIG. 5 is a schematic diagram of an aperture plate pattern of a third embodiment of the present invention.

Referring to FIG. 5, FIG. 5 is a schematic diagram of an aperture plate pattern of the third embodiment of the present invention. As shown in FIG. 5, the light-transmitting region 110 of the present invention aperture plate pattern 100 comprises a symmetric pattern aperture 114c of a square frame shape, the connection line L of a vertex P of the square frame aperture and the reference center point 104 has an included angle θ with the horizontal reference line 106. In this embodiment, the included angle θ is 45 degrees.

Figure 6:
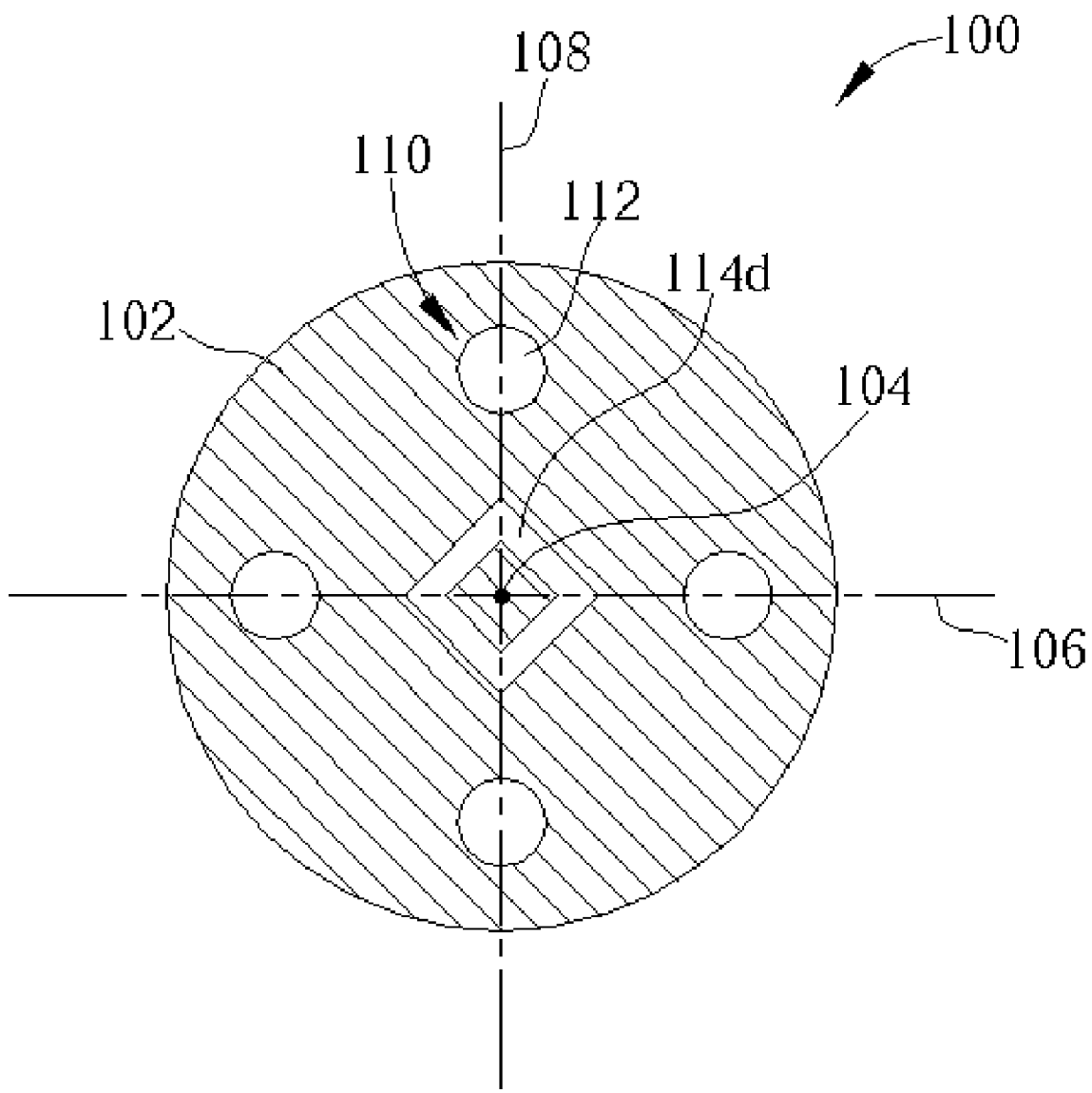
FIG. 6 is a schematic diagram of an aperture plate pattern of a fourth embodiment of the present invention.

Please refer to FIG. 6. FIG. 6 is a schematic diagram of an aperture plate pattern of the fourth embodiment of the present invention. In this embodiment, the symmetric pattern aperture 114d of the light-transmitting region 110 is also a square frame aperture. However, the four vertexes of the square frame aperture are positioned on the horizontal reference line 106 and the vertical reference line 108, as shown in FIG. 6.

Figure 7:
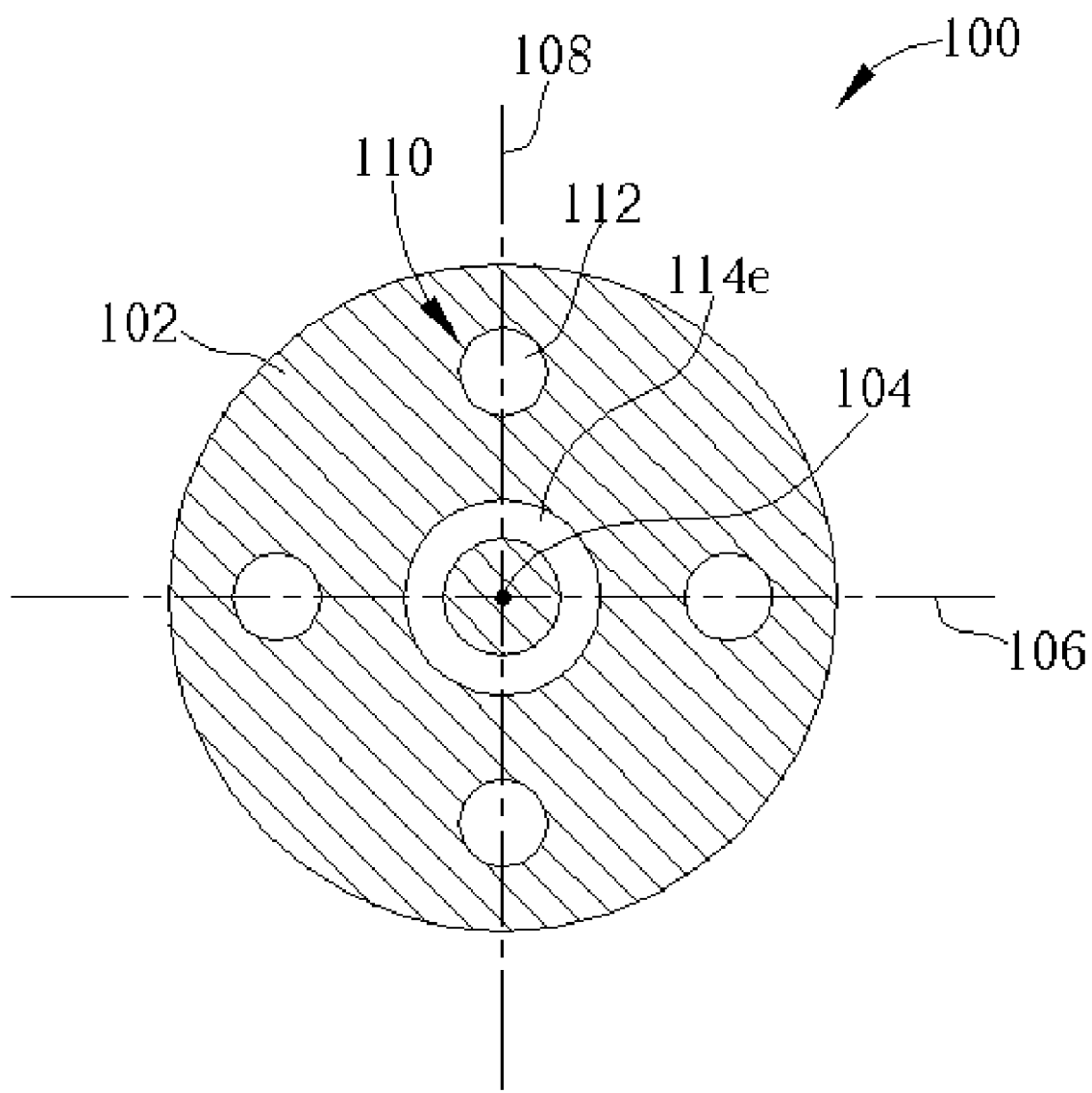
FIG. 7 is schematic diagram of an aperture plate pattern of a fifth embodiment of the present invention.

Please refer to FIG. 7, which is a schematic diagram of an aperture plate pattern of the fifth embodiment of the present invention. In this embodiment, the symmetric pattern aperture 114e is a circular aperture, wherein the center of the circular aperture overlaps the reference center point 104.

Figure 8:
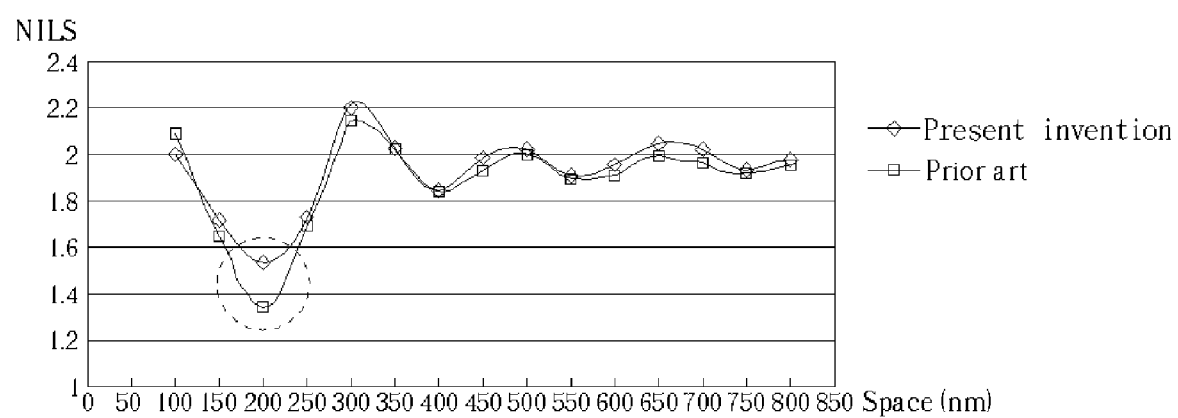
FIG. 8 is a curve diagram of the NILS versus space.
Figure 9:
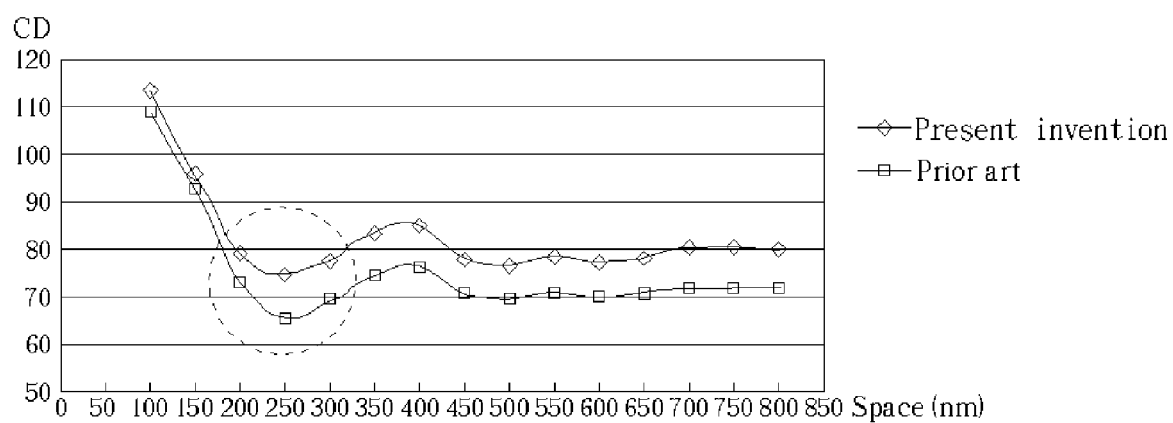
FIG. 9 is a curve diagram of the CD versus space.

FIG. 8 is a curve diagram of the NILS versus the space of the pattern of photomasks, and FIG. 9 is a curve diagram of the CD versus the space of the pattern of photomasks. Referring to FIG. 8 and FIG. 9, one can realize that the NILS and CD of the lithography system can be effectively improved by applying the present invention aperture plate (shown with the circular mark). Therefore the accuracy of the transferred pattern can be improved according to the present invention.

In contrast to the prior art, the present invention aperture plate has a symmetric pattern aperture near the middle portion of the aperture plate so that the light with small incident angles can pass through the aperture plate and contribute to define patterns on the photoresist layer. Furthermore, the NILS value can be optimized by choosing symmetric pattern apertures with different shapes and adjusting the factors $\sigma_a$, $\sigma_b$, and $\sigma_c$, and therefore the image contrast and resolution can be improved, which results in preferable lithography performance of semiconductor products with high integration.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. An aperture plate for lithography systems capable of improving normalized image log slope (NILS) comprising:
   a light-intercepting region comprising:
   a reference center point defined on the light-intercepting region;
   a horizontal reference line intersecting the reference center point; and
   a vertical reference line intersecting the reference center point; and
   a light-transmitting region comprising:
   four pole apertures, two of the pole apertures being positioned on the horizontal reference line and the other two pole apertures being positioned on the vertical reference line, wherein the four pole apertures define a central area; and
   at least a symmetric pattern aperture positioned in the central area, the symmetric pattern aperture having a symmetric center overlapping the reference center point.

2. The aperture plate of claim 1, wherein each of the pole apertures is the same distance away from the reference center point.

3. The aperture plate of claim 1, wherein the symmetric pattern aperture comprises four rectangular apertures.

4. The aperture plate of claim 3, wherein the horizontal reference line and the horizontal reference line intersect two of the four rectangular apertures as bisectors individually.

5. The aperture plate of claim 1, wherein the symmetric pattern aperture comprises four trapezoid apertures.

6. The aperture plate of claim 5, wherein the horizontal reference line and the horizontal reference line intersect two of the four trapezoid apertures as bisectors individually.

7. The aperture plate of claim 1, wherein the symmetric pattern aperture is a circular aperture.

8. The aperture plate of claim 1, wherein the symmetric pattern aperture is a square frame aperture.

9. The aperture plate of claim 8, wherein the square frame aperture has four vertexes, two of the vertexes being positioned on the horizontal reference line, and the other two vertexes being positioned on the horizontal reference line.

10. The aperture plate of claim 8, wherein the square frame aperture has four vertexes, the horizontal reference line and a connection line between one of the vertexes and the reference center point having an included angle θ.

11. The aperture plate of claim 10, wherein the included angle θ is 45 degrees.

* * * * *

UNITED STATES PATENT AND TRADEMARK OFFICE
CERTIFICATE OF CORRECTION

PATENT NO. : 7,012,763 B2
DATED : March 14, 2006
INVENTOR(S) : Wu

It is certified that error appears in the above-identified patent and that said Letters Patent is hereby corrected as shown below:

<u>Title page,</u>
Item [73], Assignee, change "Nanya Technolog Corp." to
-- Nanya Technology Corp. --.

Signed and Sealed this

Sixth Day of June, 2006

JON W. DUDAS
*Director of the United States Patent and Trademark Office*